United States Patent [19]
Lee et al.

[11] Patent Number: 5,665,203
[45] Date of Patent: Sep. 9, 1997

[54] SILICON ETCHING METHOD

[75] Inventors: Young Hoon Lee, Somers; Keith Raymond Milkove, Beacon; John William Stiebritz, Jr., Somers, all of N.Y.

[73] Assignee: International Business Machines Corporation, Armonk, N.Y.

[21] Appl. No.: 431,347

[22] Filed: Apr. 28, 1995

[51] Int. Cl.$^6$ ........................................ B44C 1/22
[52] U.S. Cl. ..................... 438/585; 438/696; 438/712; 438/714
[58] Field of Search ............... 437/57, 40, 41 GS, 437/228 SE, 228 ES, 228 ION; 156/628.1, 643.1

[56] References Cited

U.S. PATENT DOCUMENTS

| | | | |
|---|---|---|---|
| 5,242,536 | 9/1993 | Schoenborn | 156/643.1 |
| 5,252,502 | 10/1993 | Havemann | 437/41 |
| 5,256,245 | 10/1993 | Keller et al. | 437/226 |
| 5,310,456 | 5/1994 | Kadomura et al. | 156/643.1 |
| 5,336,365 | 8/1994 | Goda et al. | 156/643.1 |
| 5,505,816 | 4/1996 | Barnes et al. | 156/643.1 |
| 5,522,966 | 6/1996 | Komura et al. | 156/643.1 |

*Primary Examiner*—John S. Chu
*Attorney, Agent, or Firm*—Robert M. Trepp

[57] ABSTRACT

A method for etching silicon is described incorporating first and second steps of reactive ion etching through a patterned oxide layer in respective atmospheres of HBr, $Cl_2$ and $O_2$ and then HBr and $O_2$ in situ by terminating the first etching step and removing substantially all $Cl_2$ before continuing with the second step of etching. The invention overcomes the problem of uneven etching of n+ and p+ silicon gates for CMOS transistor logic during the step of simultaneously etching silicon to form sub 0.25 micron gate lengths and vertical sidewalls while stopping on the gate oxide.

16 Claims, 5 Drawing Sheets

SILICON ETCHING METHOD

FIELD OF THE INVENTION

This invention relates to etching of semiconductors and more particularly to reactive ion etching (RIE) of silicon and other semiconductor materials to obtain vertical sidewalls such as for polysilicon gates of CMOS field effect transistors (FET's).

BACKGROUND OF THE INVENTION

Current manufacturable gate stack Complementary Metal Oxide Silicon (CMOS) FET technology has achieved a minimum effective gate length of 0.35 µm atop a 9 nm thick gate oxide. Denser packing requirements demanded by future generations of CMOS FET technology will require 0.1 µm gate lengths on 2–3 nm thick oxides. Attempts to extend present CMOS FET technology to achieve these objectives have been unsatisfactory.

Currently in CMOS logic, both n-type and p-type transistors have polycrystalline silicon gates which are normally fabricated simultaneously by one reactive ion etching (RIE) step in a RIE plasma tool with controlled gas chemistry. In current plasma etching tools, the n-type polycrystalline Si gate structure tends to etch faster than the p-type gate structure in HBr/Cl2 plasmas commonly used for CMOS FET fabrication. Thus, n-type FET's have a shorter channel length than P-type FET's which is undesired.

One example of an RIE tool for etching polysilicon gates of FET's is described in European Patent document EP 0495524 A1 by K. S. Collins published Jul. 22, 1992. A triode etching system is used to deposit and/or etch numerous materials and uses a dynamic magnetic field to enhance the plasma density.

In U.S. Pat. No. 5,256,245 by D. J. Keller et al. which issued on Oct. 26, 1993, a chamber cleaning method is described enabling the use of a single etch chamber to etch both the dielectric hard mask and the underlying polysilicon film. A gas mix is used to remove oxide residue from the chamber walls that could cause black silicon. The oxygen scavenging gasses are C2F6, CF4, CHF3, and BCl3 are used in the plasma to liberate oxygen produced during the dielectric etch to produce an inert volatile gas which can be pumped from the chamber.

In U.S. Pat. No. 5,242,536 by P. Schoenborn which issued on Sep. 7, 1993, an anisotropic etch process is described for doped and undoped polysilicon films used in gate technology, with gate oxide thicknesses of 20 nm and minimum polysilicon gate lengths of 0.7 µm. The preferred process settings were 80 sccm Cl2, 55 sccm HBr, 40 sccm He, 270 mTorr pressure, and 0.62 W/cm2 power density. Photo resist is used as the etch mask material over the polysilicon. The process relies on HBr to form the sidewall passivation layer on the polysilicon. It is stated that the process avoids the creation of negative sidewall slopes, notches, and feet in the polysilicon gates.

SUMMARY OF THE INVENTION

In accordance with the present invention, a method for etching a semiconductor layer is described comprising reactive ion etching an exposed silicon layer through a patterned oxide layer at a pressure of less than 50 mTorr in an atmosphere of HBr, Cl2, He and O2 whereby sidewalls of the patterned silicon layer are oxidized during the step, terminating the step of reactive ion etching of the silicon layer a predetermined distance above the oxide layer, removing substantially all Cl2 from the atmosphere to provide an atmosphere of HBr, He and O2, and reactive ion etching the exposed silicon layer through the patterned oxide layer to the gate oxide layer at a pressure below 50 mTorr. The silicon layer may be a polysilicon gate electrode having partially thermal activated n and p-type dopants previously implanted. The oxide layer may be patterned with photoresist but the photoresist is completely removed such as by O2 plasma ashing. Any residual oxide on the silicon formed during the step of removing the photoresist is also removed prior to beginning the above method. Small silicon features may be formed using the above method with vertical sidewalls on a gate oxide layer 30Å thick such as for a polysilicon gate having a gate length of 0.1 µm, a vertical sidewall with plus or minus 50Å variation, for both p+ and n+ doped silicon regions.

The invention provides for partially activating ions previously implanted in silicon prior to etching to obtain identical etch behavior for n+ and p+ silicon.

The invention further provides precise lithographic pattern transfer from a photoresist to an oxide layer by etching with CHF3 and Ar.

The invention further provides perfectly vertical gate sidewalls even at sub 0.1 micron dimensions by partially activating ions previously implanted in silicon to redistribute them and by terminating the etching at a predetermined distance above the oxide layer and removing substantially all Cl2 prior to etching the remaining silicon layer.

The invention further provides use of thin gate oxides (less than 30Å as an etch stop by the step of terminating the etching at a predetermined distance above the oxide layer and removing substantially all Cl2 prior to etching the remaining silicon layer.

The invention further provides control of black silicon (from contamination) and "silicon grass" by eliminating sources of gaseous C and N during etching such as from resist, nitride masks or NF3.

The invention further provides new gas mixture during etching by first providing an atmosphere of HBr, Cl2, He and then an atmosphere of HBr, He and O2.

The invention further provides a low pressure atmosphere during etching of less than 50 mTorr and preferably 10 mTorr to increase the mean free path of the ions and hence, the vertical direction of impact of the ions on the workpiece.

The invention further provides for a low bias voltage during reactive ion etching in the range from about 50 to about 100 volts to avoid ion damage of the gate oxide layer which may be 30Å thick.

The invention further provides for no applied magnetic field during etching or a field below 40 gauss or a very uniform magnetic field to avoid uneven etching and to prevent damage to the gate oxide layer which may be 30Å thick.

BRIEF DESCRIPTION OF THE DRAWING

These and other features, objects, and advantages of the present invention will become apparent upon consideration of the following detailed description of the invention when read in conjunction with the drawing in which.

DESCRIPTION OF THE PREFERRED EMBODIMENTS

Figure 1:
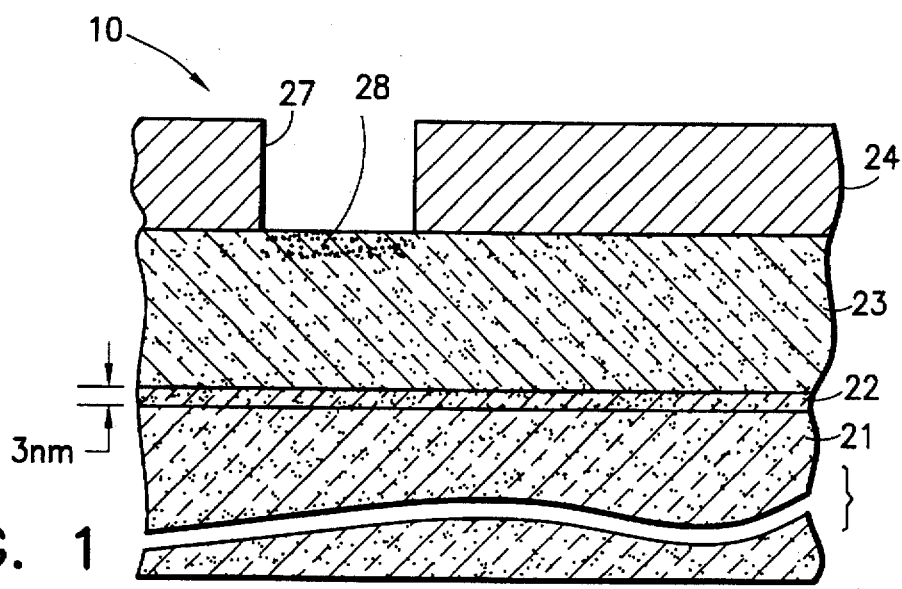
FIGS. 1–5 are cross section views showing a workpiece after completion of respective steps of a sequence of steps for simultaneously etching n and p plus polysilicon gates for CMOS field effect transistors.
Figure 2:
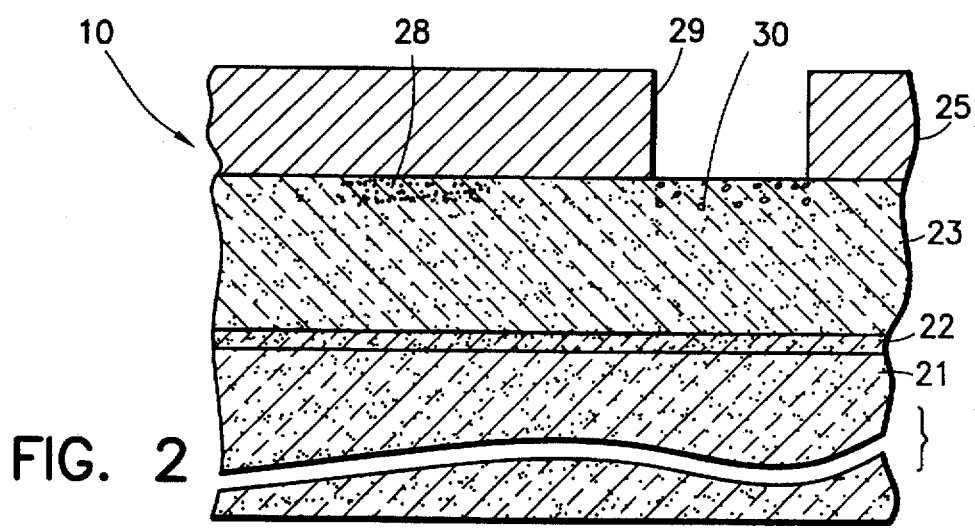
Figure 5:
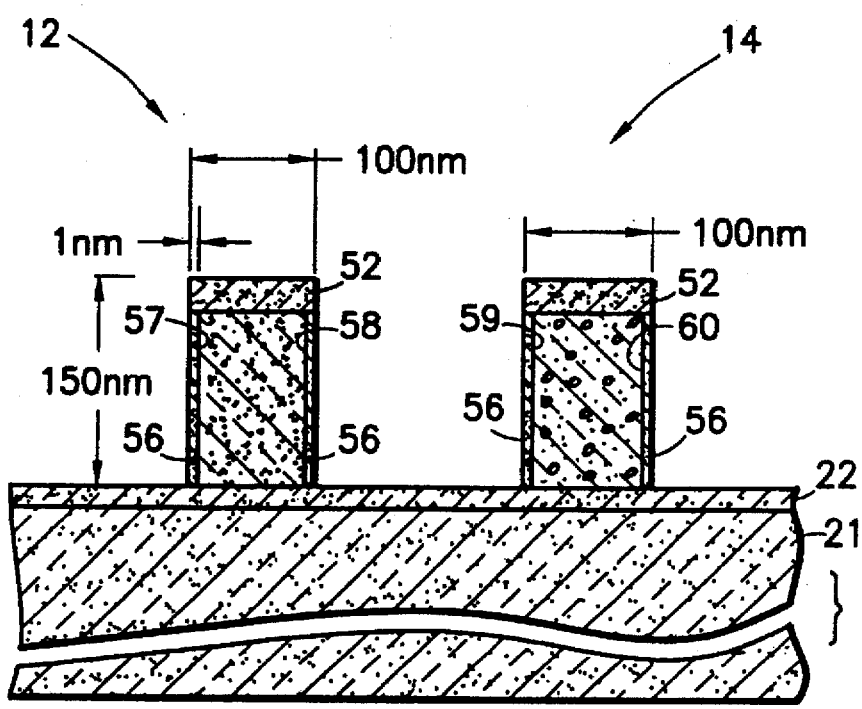

Referring to the drawing and in particular FIGS. 1 and 2, a cross section view of workpiece 10 is shown for fabricating polysilicon gates 12 and 14 shown in FIG. 5. A substrate 21 which may be for example single crystal semiconductor, polysilicon, amorphous silicon, semiconductor-on-insulator (SOI) silicon germanium, or reflective metal silicides such as titanium silicide, molydenium silicide, tungsten silicide and tantalum silicide. A dielectric layer 22 suitable as an insulator for a field effect transistor is formed over substrate 21. Where substrate 21 is silicon, dielectric layer 22 may be a thermally grown 3 nm silicon dioxide gate layer. A blanket layer 150 nm thick may be formed by Low Pressure Chemical Vapor Deposition (LPCVD) over dielectric layer 22 to provide an intrinsic polysilicon layer 23. Polysilicon layer 23 is then subjected to two iterations of patterned photoresist 24 and 25 in FIGS. 1 and 2 respectively. Polysilicon layer 23 could be replaced with silicon, silicon germanium, and amorphous silicon.

Patterned photoresist 24 provides isolated regions or openings 27 for ion implantation of n+ (phosphorus) dopants into regions 28 in polysilicon layer 23 as shown in FIG. 1. Then, patterned photoresist 25 provides isolated regions or openings 29 for ion implantation of p+ (boron) dopants into regions 30 in polysilicon layer 23 as shown in FIG. 2.

Figure 3:
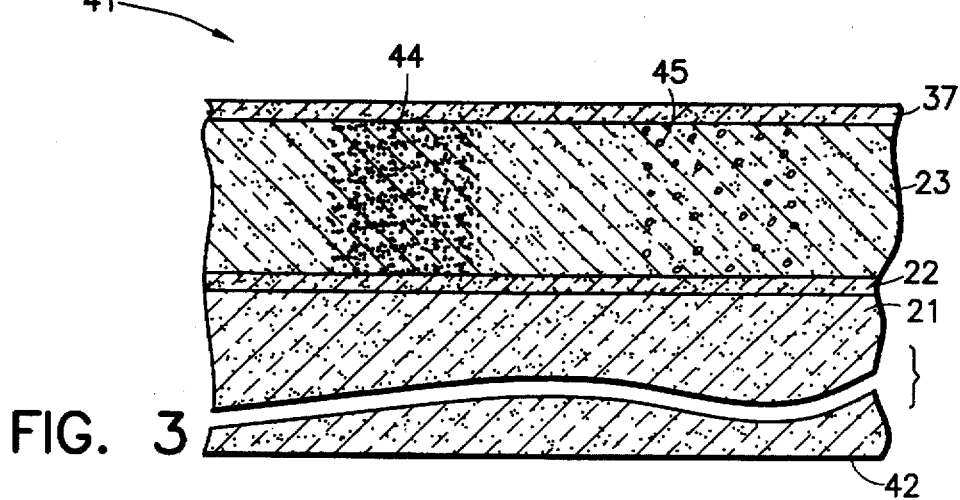

Following each ion implantation step, the patterned photoresist 24 and 25 respectively is stripped off polysilicon layer 23 in an oxygen plasma asher, emersed in a hot sulfuric/nitric acid mixture, rinsed in deionized (DI) water, and spin-dried. The process steps continue with the blanket deposition of a 50 nm thick low temperature oxide (LTO) to form oxide layer 37 as shown in FIG. 3.

Subsequently, the top side of wafer 41 e.g. LTO layer 37 is protected by a layer 40 of photoresist (not shown) while all accumulated process coatings (not shown) are stripped from the backside 42 of the wafer 41.

Next, layer 40 of photoresist on the top side 38 is removed using the oxygen plasma asher sequence described above. Then the dopants in regions 28 and 30 are homogenized across the thickness of the polycrystalline layer 23 as shown by n+ region 44 and p+ region 45 respectively in FIG. 3. Regions 28 and 30 are homogenized to form regions 44 and 45 by partial thermal activation entailing either a rapid thermal process anneal (RTP) for 5 seconds in argon at 900° C. or a 30 minute furnace anneal at 750° C.

Figure 4:
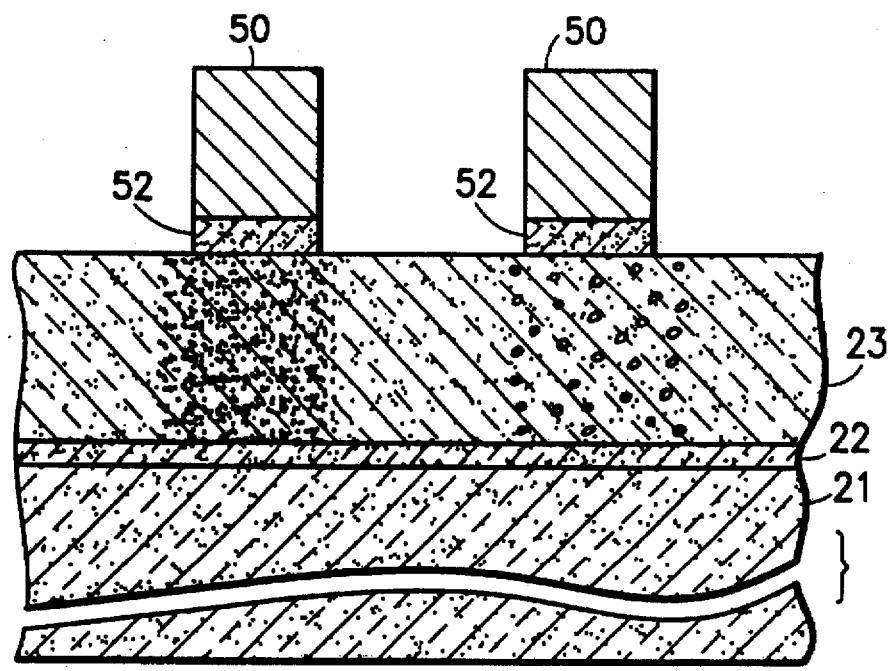

Next, an e-beam or x-ray lithographic mask 50 is used to define a 0.1 µm long gate pattern on LTO layer 37. This pattern is then transferred into LTO layer 37 using reactive ion etching to form LTO oxide mask 52 as shown in FIG. 4. The etch is carried out in a gas ambient of 30 sccm of $CHF_3$ mixed with 60 sccm of Ar at a power of 200 W (1.6 W/cm$^2$) and a pressure of 10 mTorr. A 20% overetch is employed as determined by laser end point detection. The reactive ion etching was specifically designed to operate at a low pressure of about 10 mTorr to cut down on ion scattering in order to produce a reduction in the lateral etch component of the LTO oxide mask 52. The power was chosen to produce a small self-bias voltage, while maintaining an acceptable oxide etch rate, in order to avoid the possibility of charge accumulation damage to the underlying gate oxide which is dielectric layer 22. Along this same line of reasoning, the dynamic magnetic field option available with the etch tool was kept off or disabled to provide magnetic field in the range from 0 to 40 gauss. It was believed that the magnetic field gradients would increase the possibility of charge damage to the gate oxide which is dielectric layer 22.

Next, lithographic mask 50 is stripped away using the oxygen plasma asher sequence described above for removing patterned photoresist 24 and 25. Finally, n+ region 44 and p+ region 45 are formed into polysilicon gates 12 and 14 by reactive ion etching polysilicon layer 23 as shown in FIG. 5.

A three step, two chamber etch procedure is required to complete this portion of the process.

First in a first chamber, a 10 second exposure to a $CF_4$ plasma at 100 W (0.8 W/cm$^2$) and 10 mTorr is employed to remove any surface oxide that may have formed on polysilicon layer 23 during the immediately preceding step of stripping lithographic mask 50. The wafer 41 is then transferred to a second chamber, without breaking vacuum, to a dedicated silicon etching chamber that is free of photoresist contamination i.e. lithographic mask 50 contamination. All but 20 nm of polysilicon layer 23 is initially etched at a fast rate in a gas mix or atmosphere of 45 sccm HBr, 15 sccm $Cl_2$, and 3 sccm of a 70% He and 30% $O_2$ mix at a power of 200 W (power density =1.6 W/cm$^2$) and a pressure of 10 mTorr. The pressure may be in the range from about 1 to about 50 mTorr and preferably from about 1 to about 15 mTorr. As the etch proceeds a thin oxide layer 56 forms on gate sidewalls 57–60 by plasma anodization.

In the second step, $Cl_2$ is completely eliminated from the gas mix to provide a high selectivity in a subsequent etch to silicon without etching dielectric layer 22 which here is a gate oxide. In the step of removing $Cl_2$, the partial pressure of $Cl_2$ should be reduced to less than about $10^{-6}$ Torr.

In the third step, a final low power, low pressure, highly selective silicon to silicon dioxide etch is performed with a gas ambient of 45 sccm HBr and 3 sccm of 70% He and 30% $O_2$ at a power of 50 watts (power density +0.4 W/cm$^2$) and a pressure of 10 mTorr. The pressure may be in the range from about 1 to about 50 mTorr and preferably from about 1 to about 15 mTorr. Typically, an overetch time of 50 % was employed based on the time for the final etch step to reach the gate oxide, dielectric layer 22 as observed by laser endpoint. However, RIE etch times as long as 200% on the 3 nm gate oxide is possible without any evidence of punch-through.

Of the three steps, it should be noted that the two silicon etch steps, steps 1 and 3, both used the previously explained mask etch philosophy of low pressure, low power density, and no magnetic field enhancement in the first or second chambers. It was also found that eliminating the magnetic field unexpectedly improved the etch uniformity in the silicon etch chamber, the second chamber.

A fourth step in the gate etch process of the invention is a brief dip in dilute HF to remove any possible residue of oxide layer 56 from gate sidewalls 57–60.

As MOS and CMOS gate manufacturing dimensions shrink to 0.1 µm dimensions and beyond, the reactive ion etching process described herein provides an acceptable manufacturing process.

From circuit considerations, there will be tight dimensional control of n and p channel FET's gate lengths, especially gate lengths of 0.1 µm which requires the lateral etch of the gate to be less than +/−5 nm. The words "lateral etch of the gate to be less than +/−5 nm" is defined to mean that with respect to each sidewall there may be a +/−5 nm deviation from the average sidewall position. Thus for the polysilicon gate the width may vary from an average width of +/−10 nm. This requirement places stringent etch demands on both the gate oxide mask and the underlying polysilicon etch process to form the gate. In particular, the key to a viable gate etch process is the ability to create an extremely thin and hard (resists reactive ion etching) passivating layer 56 on gate sidewalls 57–60 to ensure substantially vertical etch profiles for both n+ and p+ polysilicon gates for example gates 12 and 14 shown in FIG. 5. The successful development of oxide layer 56 on polysilicon gate sidewalls provides for extending the silicon gate etch process technology described herein far below 0.1 µm dimensions or feature size.

Moreover, there is a silicon etch dependence on the silicon dopant specie and concentration which has been addressed. Doping effects are responsible for an etch bias or etch rate difference in n+ silicon over p+ silicon. In point of fact, the etch effect produces a 30% etch bias at 0.1 µm gate dimensions using state-of-the-art methods. It is customary to eliminate the etch bias by employing an overetch on the gate oxide etch stop layer. Unfortunately, with reduction from the current 9 nm gate oxide thickness required for 0.35 µm gate lengths down to a 3 nm gate oxide for a 0.1 µm gate length dimension, risk of punching through the 3 nm gate oxide at the base of the faster etching n+ gates is high before acceptably narrowing the p+ polysilicon gate lengths by over etching.

Further, as wafer size increases from 200 mm (8 inches) to 300 mm (12 inches), the across wafer etch uniformity will probably be worse. Under such conditions it will be necessary to compensate for the additional nonuniformity by employing a more sustained overetch at the conclusion of the gate etch process, even though as it has just been noted above, the new CMOS device technology actually requires a reduction in gate oxide thickness from 9 nm to 3 nm for optimal speed and power supply voltage.

With critical dimensions continuing to decrease, device yield will likely also decrease. In order to avoid further yield loss, it is desirable to provide etch processes that are not prone to contamination, such as from a polymeric layer created from photoresist mask erosion during RIE processing. A silicon dioxide mask or other inorganic dielectric mask material is required to etch the polysilicon layer to form the polysilicon gates of CMOS logic.

Figure 6:
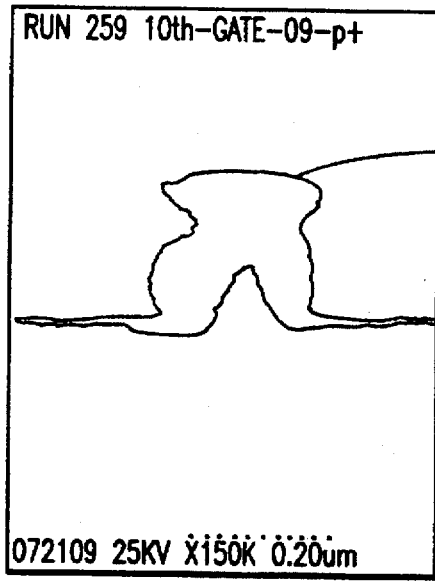
FIG. 6 shows p+ polysilicon etch results using the inventive method without thermal activation of ion implanted p-type dopants.
Figure 7:
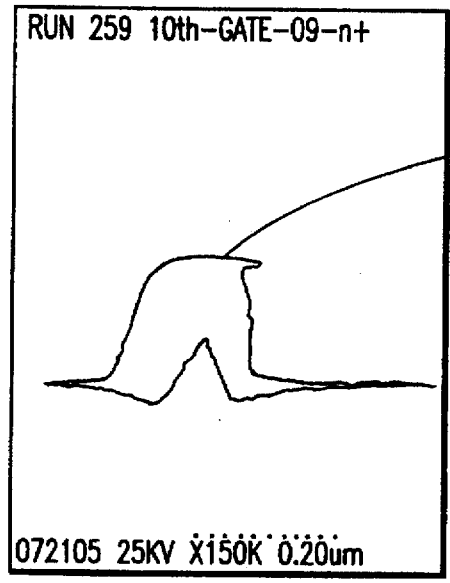
FIG. 7 shows n+ polysilicon etch results using the inventive method without thermal activation of ion implanted n dopants.

FIGS. 6 and 7 show a scanning electron microscope (SEM) cross section view of a polysilicon gate using the etching process described herein. FIG. 6 shows a 0.1 µm p+ polysilicon gate 64 without thermal activation of the dopant ions. FIG. 7 shows a 0.1 µm n+ polysilicon gate 65 without thermal activation of the dopant ions.

Figure 8:
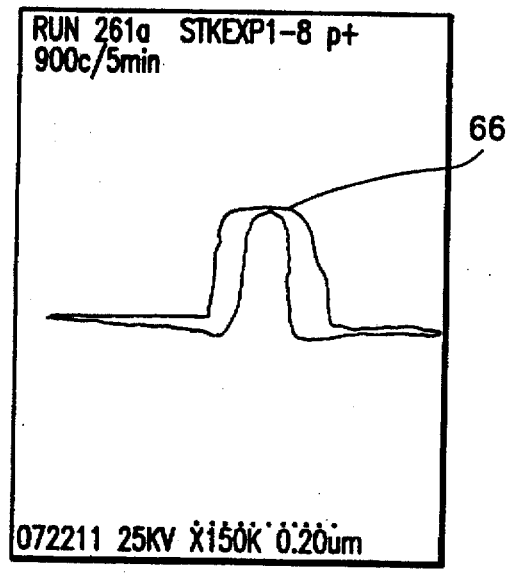
FIG. 8 shows p+ polysilicon etch results using the inventive method with thermal activation of ion implanted p dopants.
Figure 9:
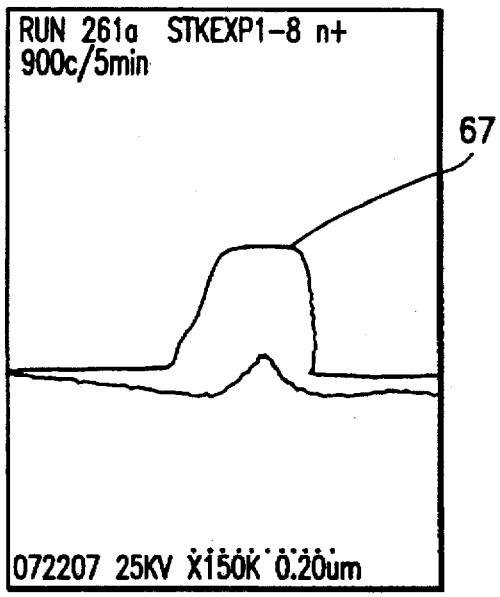
FIG. 9 shows n+ polysilicon etch results using the inventive method with thermal activation of ion implanted n-dopants.

FIGS. 8 and 9 correspond to FIGS. 6 and 7 except the step of etching followed a 5 minute anneal at 900° C. FIG. 8 shows a 0.1 µm p+ gate 66 with thermal activation of ion implanted p dopants. FIG. 9 shows a 0.1 µm n+ polysilicon gate 67 with thermal activation of ion implanted n dopants.

Figure 10:
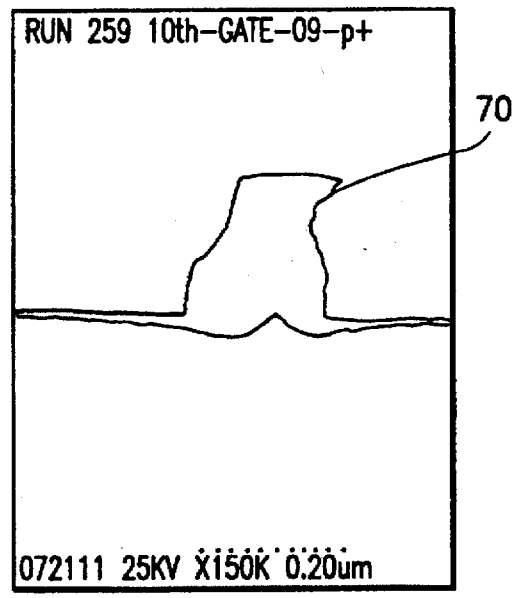
FIG. 10 shows p+ polysilicon etch results using the inventive method without thermal activation of ion implanted p dopants.
Figure 11:
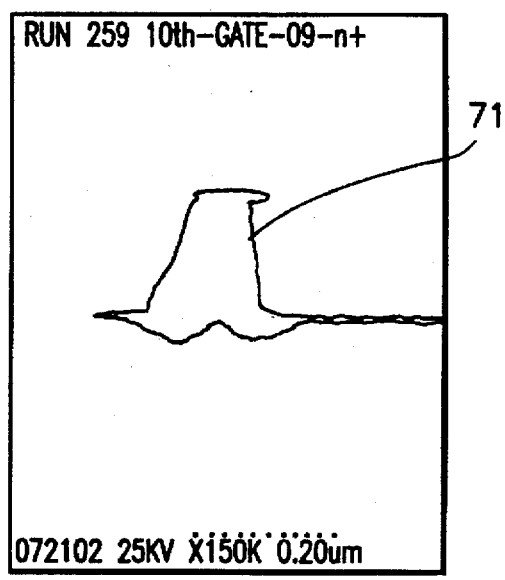
FIG. 11 shows n+ polysilicon etch results using the inventive method without thermal activation of ion implanted n dopants.
Figure 12:
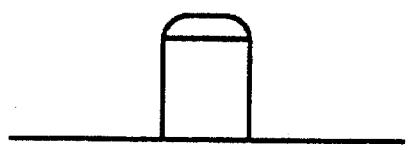
FIGS. 12–17 show traces taken from the SEM images of FIGS. 6–11, respectively, showing the outline of the polysilicon gate and its sidewalls.
Figure 13:
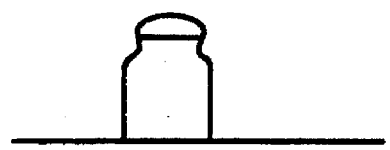
Figure 14:
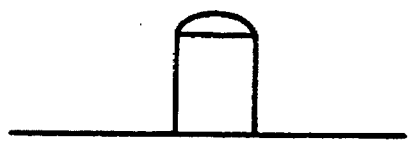
Figure 15:
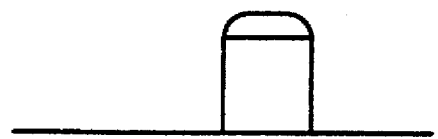
Figure 16:
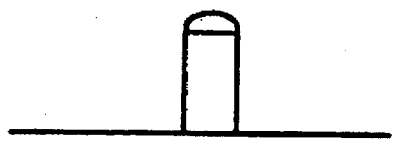
Figure 17:
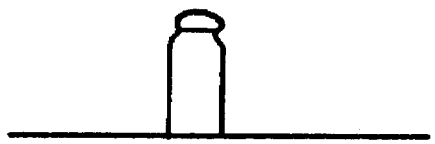

FIGS. 10 and 11 show a scanning electron microscope (SEM) cross section view of a polysilicon gate using the etching process described herein. FIG. 10 shows a 0.04 µm p+ polysilicon gate 70 without thermal activation of the dopant ions in the polysilicon. FIG. 11 shows a 0.04 µm n+ polysilicon gate 71 without thermal activation of the dopant ions in the polysilicon.

In FIGS. 6–11 addition white areas appear outside the sidewalls of the polysilicon gate due to space change formed during operation of the SEM. However, the cross section views of FIGS. 6–11 show that the gate lengths for p+ and n+ polysilicon gates undergoing simultaneous etching have about equal gate lengths. FIGS. 6 and 7, 8 and 9, and 10 and 11 underwent simultaneous etching respectively.

In FIGS. 6–11, the gate length is defined as the width of the polysilicon at the interface with the gate oxide layer. In FIGS. 6–9, the gate length as measured from a trace taken from the SEM images is 120 nm. In FIGS. 6–11, the polysilicon gate height is 1500Å. A layer of oxide on top of the polysilicon gate was originally 50 nm prior to RIE. After RIE the layer of oxide on top of the polysilicon gate is about 30 nm.

In FIGS. 10 and 11, the gate length as measured from a trace taken from the SEM images is 72.5 nm.

In FIGS. 6–11, the actual sidewall positions of the polysilicon gate are nominally located in the middle of the intense white area of the SEM images.

FIGS. 12–17 show traces taken from the SEM images of FIGS. 6–11, respectively, showing the outline of the polysilicon gate and its sidewalls.

While there has been described and illustrated a process for etching silicon, polysilicon, amorphous silicon or silicon germanium by reactive ion etching to obtain accurate pattern transfer and vertical sidewalls such as for polysilicon gates of CMOS field effect transistors, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A method for forming vertical sidewalls from a silicon layer situated on top of a dielectric layer, comprising the steps of:

provided a patterned oxide layer on top of said silicon layer protecting the areas which are not to be etched during a subsequent etch step, and leaving other areas thereof exposed, first reactive ion etching the exposed areas of the silicon layer through the patterned oxide layer at a pressure of less than 50 mTorr in an atmosphere of HBr, $Cl_2$, and $O_2$ whereby sidewalls of the patterned silicon layer are oxidized during said step, terminating said step of first reactive ion etching of said silicon layer a predetermined distance above said dielectric layer, removing substantially all $Cl_2$ from said atmosphere, and second reactive ion etching the exposed areas of the silicon layer through said patterned oxide layer down to said dielectric layer at a pressure below 50 mTorr.

2. The method of claim 1, wherein said step of terminating includes the step of terminating first reactive ion etching 20 to 30 nm above said dielectric layer.

3. The method of claim 1, wherein said step of second reactive ion etching includes the step of providing a very low power density plasma in the range from 0.3 W/cm$^2$ to 10 W/cm$^2$.

4. The method of claim 1, wherein said step of second reactive ion etching includes the step of providing an atmosphere of HBr and O$_2$ flowing through the plasma chamber.

5. The method of claim 1, wherein said step of second reactive ion etching includes the step of continuing to etch said silicon layer and the lower portions of said sidewalls to form vertical sidewalls down to said dielectric layer.

6. The method of claim 1, further including the steps of first forming a blanket polysilicon layer over said dielectric layer, implanting ions into said polysilicon layer, forming an oxide layer to function as a mask over said polysilicon layer, activating by partial thermal activation and redistribution of the implanted ions in said polysilicon layer, coating said oxide layer to function as a mask oxide layer with resist, lithographically patterning said oxide layer to function as a mask oxide layer, etching the oxide layer to function as a mask oxide layer to form the patterned oxide layer, removing said patterned resist, removing residual oxide from said polysilicon layer exposed by said patterned oxide and formed during said step of removing said resist, and controlling the ambient atmosphere after said step of removing to prevent oxidation of said polysilicon layer.

7. The method of claim 1 wherein said second reactive ion etching step includes the step of providing an atmosphere including HBr and O$_2$.

8. The method of claim 1 wherein said second reactive ion etching step includes the step of providing an atmosphere including HBr, He and O$_2$.

9. The method of claim 1 wherein said first reactive etching step includes providing a magnetic field in the range from 0 to 40 gauss.

10. The method of claim 1 wherein said first reactive ion etching step includes the step of providing a pressure in the range from 1 to 15 mTorr.

11. The method of claim 1 wherein said second reactive ion etching step includes the step of providing a pressure in the range from 1 to 15 mTorr.

12. The method of claim 1 wherein said first reactive ion etching step includes the step of supplying He to said atmosphere.

13. The method of claim 1 further including the step of selecting a silicon layer from a group consisting of single crystal silicon, polysilicon, amporphous silicon and silicon germanium alloy.

14. The method of claim 1 further including the step of removing any surface oxide that may have formed on an exposed silicon layer prior to said step of first reactive ion etching.

15. The method of claim 14 further including the steps of placing said silicon layer in a first chamber, reactive ion etching with a CF$_4$ plasma and transferring said silicon layer to a second chamber under a controlled atmosphere and pressure.

16. The method of claim 1, wherein said dielectric layer is a silicon dioxide layer intended to serve as gate oxide of a device to be formed.

* * * * *